United States Patent (10) Patent No.: US 7,605,466 B2
Aimi et al. (45) Date of Patent: Oct. 20, 2009

(54) SEALED WAFER PACKAGING OF MICROELECTROMECHANICAL SYSTEMS

(75) Inventors: Marco Francesco Aimi, Niskayuna, NY (US); Christopher James Kapusta, Delanson, NY (US); Arun Virupaksha Gowda, Niskayuna, NY (US); David Cecil Hays, Niskayuna, NY (US); Oliver Charles Boomhower, Waterford, NY (US); Glenn Scott Claydon, Wynantskill, NY (US); Joseph Alfred Iannotti, Glenville, NY (US); Christopher Fred Keimel, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 210 days.

(21) Appl. No.: 11/872,562

(22) Filed: Oct. 15, 2007

(65) Prior Publication Data
US 2009/0096088 A1 Apr. 16, 2009

(51) Int. Cl.
*H01L 23/34* (2006.01)
(52) U.S. Cl. .................. 257/723; 257/E23.01; 438/107
(58) Field of Classification Search .......... 257/723, 257/E23.01; 438/107
See application file for complete search history.

(56) References Cited
U.S. PATENT DOCUMENTS
4,783,695 A 11/1988 Eichelberger et al.

| 5,374,792 | A | 12/1994 | Ghezzo et al. |
| 6,441,481 | B1 | 8/2002 | Karpman |
| 6,767,764 | B2 | 7/2004 | Saia et al. |
| 6,773,962 | B2 | 8/2004 | Saia et al. |
| 6,788,981 | B2 | 9/2004 | Garverick et al. |
| 6,791,742 | B2 | 9/2004 | Staker et al. |
| 6,809,753 | B2 | 10/2004 | Tu |
| 6,864,111 | B2 | 3/2005 | Yu et al. |
| 6,920,203 | B2 | 7/2005 | Short et al. |
| 6,929,974 | B2 * | 8/2005 | Ding et al. .................. 438/106 |
| 6,943,495 | B2 | 9/2005 | Ma et al. |
| 6,946,728 | B2 | 9/2005 | Chen et al. |
| 6,969,639 | B2 | 11/2005 | Cho et al. |
| 6,987,304 | B2 | 1/2006 | DCamp et al. |
| 7,030,536 | B2 | 4/2006 | Smith et al. |
| 7,075,160 | B2 | 7/2006 | Partridge et al. |
| 2005/0156259 | A1 | 7/2005 | Yuasa |
| 2006/0131731 | A1 * | 6/2006 | Sato ............................ 257/704 |
| 2006/0216654 | A1 | 9/2006 | Fries et al. |
| 2007/0269934 | A1 * | 11/2007 | Thompson et al. .......... 438/127 |
| 2009/0023249 | A1 * | 1/2009 | Honer et al. ................. 438/113 |

* cited by examiner

Primary Examiner—Trung Dang
(74) Attorney, Agent, or Firm—Richard Emery

(57) ABSTRACT

Multiple microelectromechanical systems (MEMS) on a substrate are capped with a cover using a layer that may function as a bonding agent, separation layer, and hermetic seal. A substrate has a first side with multiple MEMS devices. A cover is formed with through-holes for vias, and with standoff posts for layer registration and separation. An adhesive sheet is patterned with cutouts for the MEMS devices, vias, and standoff posts. The adhesive sheet is tacked to the cover, then placed on the MEMS substrate and heated to bond the layers. The via holes may be metalized with leads for circuit board connection. The MEMS units may be diced from the substrate after sealing, thus protecting them from contaminants.

17 Claims, 5 Drawing Sheets

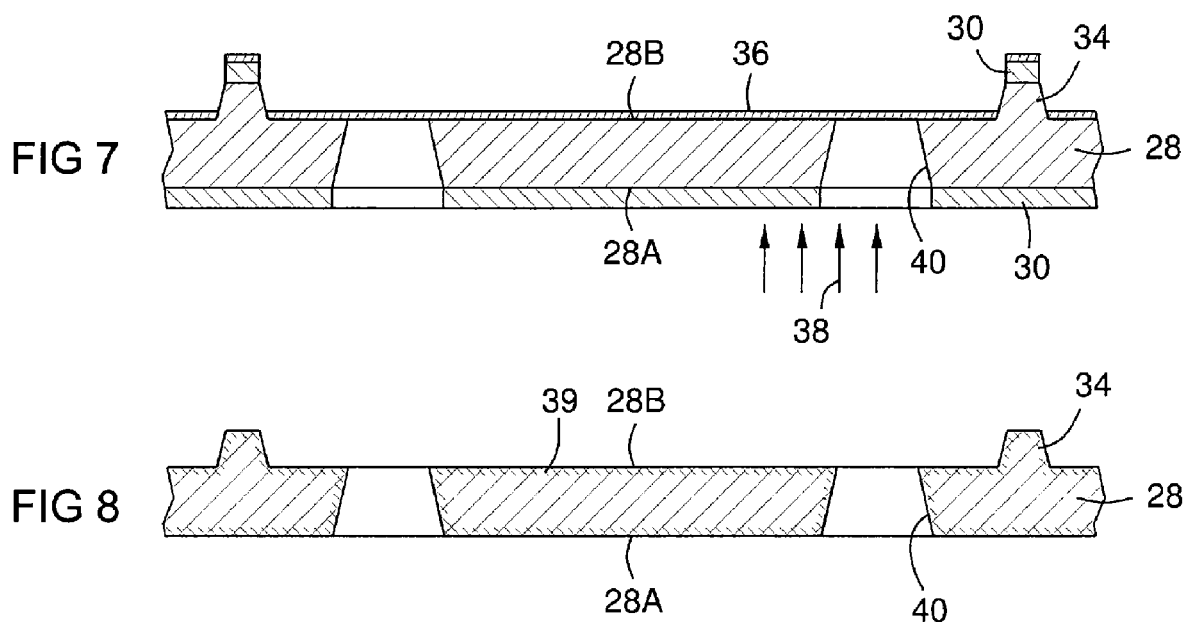
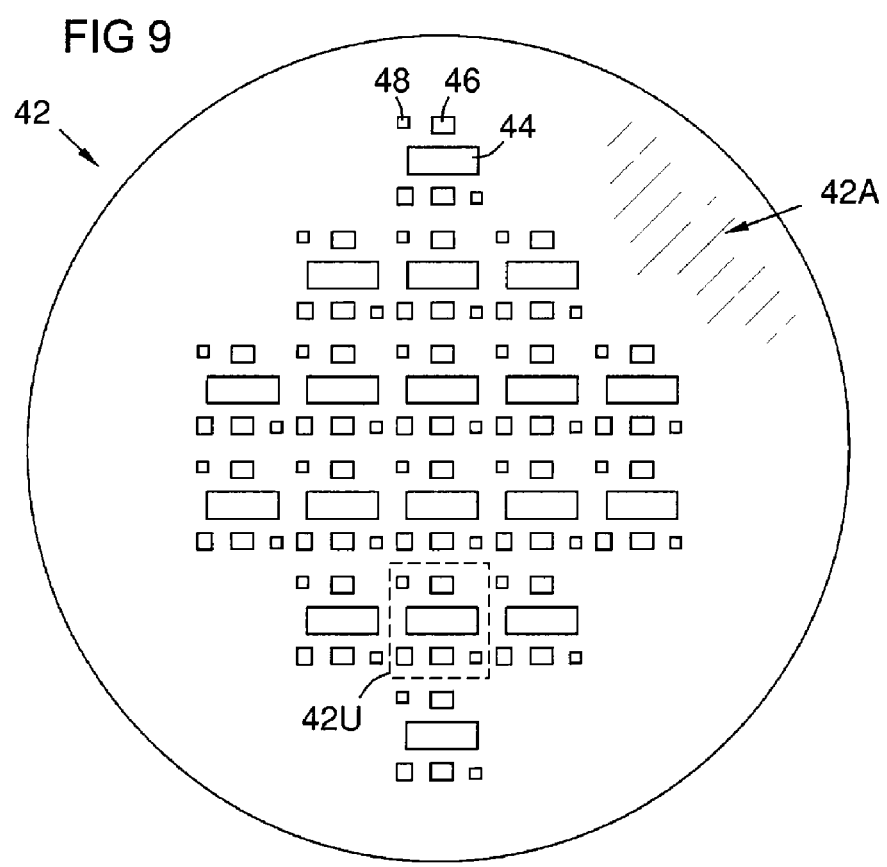

SEALED WAFER PACKAGING OF MICROELECTROMECHANICAL SYSTEMS

BACKGROUND

The present invention relates to sealing and packaging of microelectromechanical fabricated devices on a device substrate before dicing.

Microelectromechanical systems (MEMS) are miniaturized devices, such as microswitches that may range in size from about 1 micron to about 1 mm. These devices generally require a controlled environment to operate for a long period of time. Introduction of contaminants such as moisture, particulates or oxygen into the gas surrounding the device can cause sticking, contamination, or interference of the metal contacts, leading to device failure. MEMS devices are often manufactured in an array on a silicon wafer, and then separated or diced into individual units. Such separation is called "singulating". Dicing produces random particles that can contaminate and disable some of the microdevices.

There are known wafer-level packaging processes that may use bonding techniques such as a silicon/gold eutectic bond or gold/gold thermal compression bonding. However, these bonding materials produce an electrically conductive bond, which may introduce constraints as to how the wafers can be bonded and how the device layout may be configured. Another known bonding material is glass frit, or powdered glass. However, this must be screen-printed onto one of the wafers, which can cause contamination of MEMS devices, it limits the process capability of through-wafer cavities and has the potential for outgassing over the operational lifetime of the device.

BRIEF DESCRIPTION OF THE INVENTION

An aspect of the invention resides in forming a cover, and bonding it to a substrate with multiple MEMS devices via a patterned adhesive sheet to seal the MEMS devices before dicing them into individually packaged microdevices.

Another aspect of the invention resides in packaging MEMS devices using an adhesive sheet without additional adhesives to reduce the outgassing potential and at a low enough temperature to avoid damage to MEMS actuators.

Another aspect of the invention resides in reducing MEMS production cost and increasing device yield and reliability by wafer-level capping under controlled atmospheric conditions prior to dicing.

Another aspect of the invention resides in reducing MEMS package size by bonding a MEMS device cover with an efficient hermetic seal that requires minimal material for sealing.

Another aspect of the invention resides in reducing MEMS height requirements on a circuit board by forming short MEMS device leads that require negligible space between the MEMS package and circuit board contacts.

Another aspect of the invention resides in minimizing radio frequency reflections and interconnection loss and improving thermal efficiency by minimizing lead length and angles to the MEMS internal pads.

Another aspect of the invention resides in providing electrical isolation between the cover and the device substrate.

Another aspect of the invention resides in bonding of dissimilar materials including semiconductors, insulators and metals.

Another aspect of the invention resides in the increased process flexibility of placing the vias through the cover and enabling a solder filled via.

Another aspect of this invention resides in the ability of this solder filled via to be mounted to a circuit board using standard die attachment techniques.

Another aspect of this invention resides in placing the solder in close proximity to the MEMS device to improve the thermal and electrical performance.

Another aspect of the invention resides in providing a standoff that prevents the adhesive sheet from undesirable encroachment.

Another aspect of the invention resides in providing a method of improvement for placing the cover a predetermined distance above the MEMS device. This method can be used to add electrical and mechanical functionality to the device cap.

Another aspect of the invention is to use the standoffs for making an electrical connection and/or thermal connection to the device.

Another aspect of the invention is improving the registration of the adhesive sheet to the cover through the use of mechanical interlock between the standoff and the adhesive sheet.

Another aspect of this invention is the scalability of the adhesive sheet and the whole process from small wafers to full flat panel size sized substrates.

Another aspect of this invention is the ability of the adhesive sheet to create a hermetic seal over large topology on the substrate.

Another aspect of the invention is the reduced stress build up due to thermal strain on the MEMS device due to the elastic modulus of the adhesive sheet being lower than the substrate.

Another aspect of the device is the shock absorption properties of the adhesive sheet. A MEMS device is sensitive to shock, with a time constant near the resonant frequency of the device that is about 200 KHz or 5 microseconds. A shock absorber may act as a low-pass filter, reducing this component of shock with a relatively short time constant.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

The terms "top" and "bottom" are not used here because parts of the assembly are processed partly in one orientation, and partly in another. Instead, the terms "first side" and "second side" are used, such that all of the first sides eventually face the same direction in the finished MEMS unit. For conceptual clarity, the sectional views show standoff posts 34 in the section planes. However, standoff posts can be placed in any vacant area of the pattern, as shown in surface views such as FIGS. 11-13.

FIG. 7 shows a second etching process that forms via holes through the cover to the working layer.

FIG. 8 shows the patterned cover after stripping of the working layer and the mask material.

FIG. 9 shows a first side of an adhesive sheet that is cut to match the MEMS substrate and the cover, and is patterned with cutouts for the MEMS devices, vias, and standoff posts.

DETAILED DESCRIPTION OF THE INVENTION

The present inventors have innovatively recognized that certain properties of an adhesive sheet embodying aspects of the present invention are conducive to an improved MEMS package and fabrication process, as will be described in greater detail below. In one example embodiment, the adhesive sheet can be a thermoplastic material. Some thermosets like epoxy or epoxy-based adhesives outgas during the cross-linking process. This gas can enter a MEMS device cavity, limiting control over the cavity environment. A thermoplastic does not need to cure, because there is no cross-linking involved with the bonding process. A thermoplastic also does not necessarily need an adhesive layer on either of the bonding surfaces. Some epoxies and other adhesives need such additional adhesive layer(s) to ensure proper bonding. The adhesive sheet is also an electrical insulator that enables passing electrical traces through the bond line without having to passivate them. The adhesive sheet can be formed without the need of a backing layer, enabling the present fabrication process. The adhesive sheet has a flow temperature high enough to allow post-processing such as solder filling of a via without debonding the cover and a flow temperature low enough to avoid damage to the MEMS devices. The adhesive sheet can be patterned by etching and/or ablation. One possible material for this adhesive sheet is liquid crystal polymer (LCP).

Figure 1:
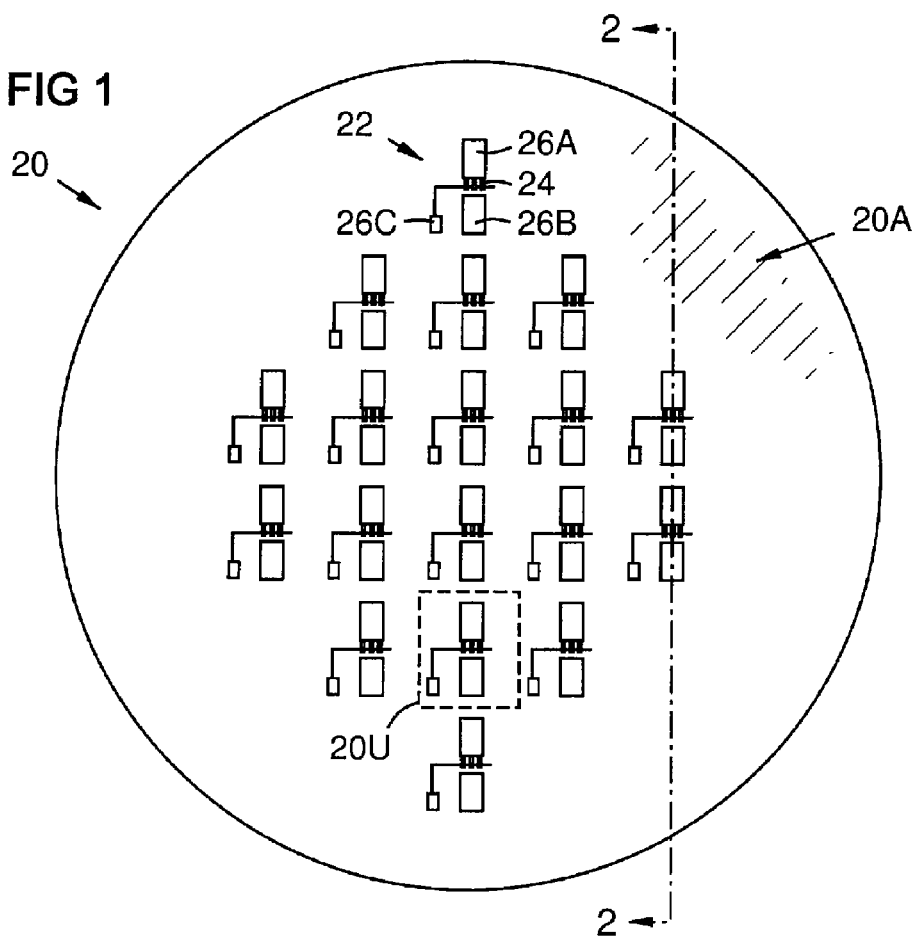
FIG. 1 is a first side view of a substrate with multiple MEMS devices.
Figure 2:
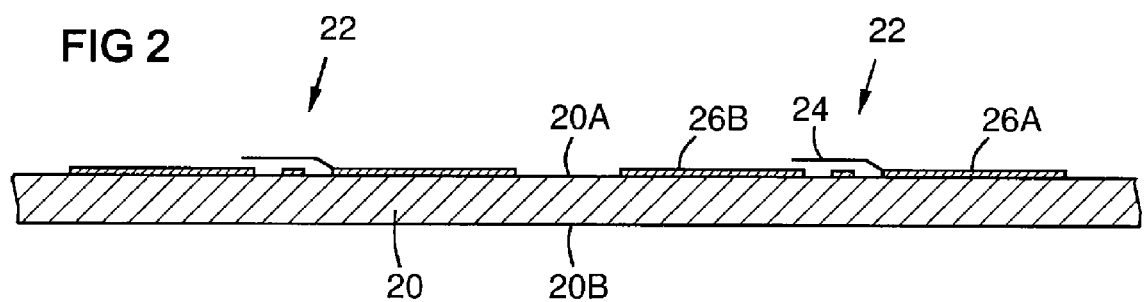
FIG. 2 is a partial sectional view taken along line 2-2 of FIG. 1.

The drawings show exemplary structure for packaging MEMS units using wafer-level capping. FIG. 1 illustrates an example MEMS substrate 20 as may be sealed in accordance with aspects of the present invention. MEMS substrate 20 may be formed as currently known or to be developed in the art. It has a first side 20A with multiple MEMS units 22, each of which has an electromechanical actuator 24 and electrical contact pads 26A-C within a unit area 20U. It has a second side 20B. FIG. 2 shows a schematic partial sectional view of two such MEMS units 22.

Figure 3:
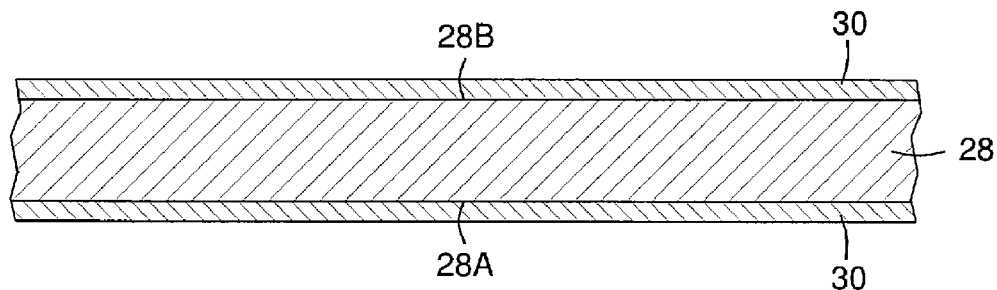
FIG. 3 is a partial sectional view of a cover fabrication in progress, the cover coated with a mask material.
Figure 4:
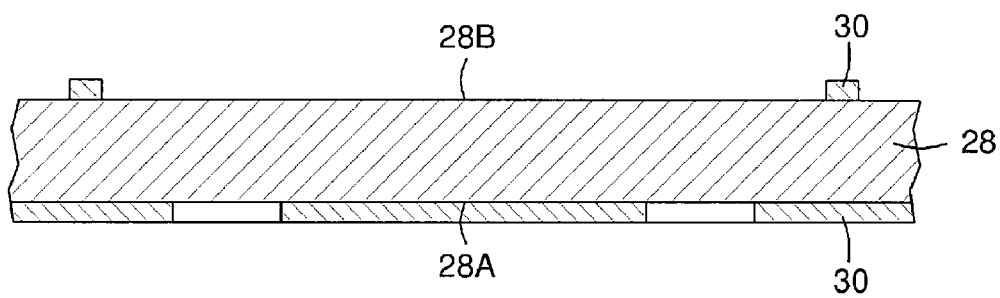
FIG. 4 shows the mask material patterned by removing parts of it to produce an etching mask on each side.

FIG. 3 shows a partial sectional view of a cover 28 with first and second sides 28A, 28B coated with a mask material 30 such as silicon nitride ($Si_3N_4$). The cover may be made of silicon as currently known or to be developed in the art of MEMS packaging. FIG. 4 shows the mask material 30 patterned by removing parts of it to produce an etching mask on each side. This patterning and removal can be done by photolithography and dry etching or other methods as currently known or to be developed.

Figure 5:
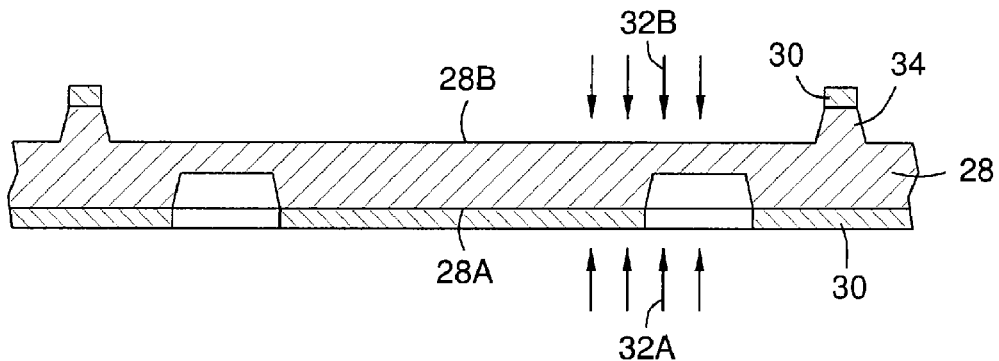
FIG. 5 shows a first etching process that selectively reduces both sides of the cover where not masked.
Figure 6:
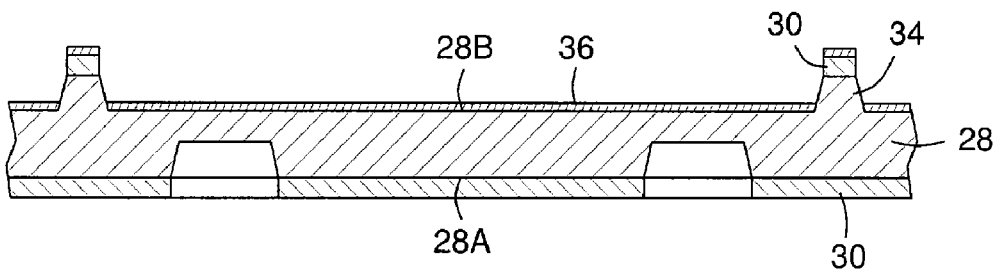
FIG. 6 shows a working layer deposited on a second side of the cover to facilitate a second etching process from the first side.

FIG. 5 shows an example anisotropic etching process 32A, 32B that may be used to selectively reduce sides 28A, 28B of the cover 28 where not masked. This process may be done wet or dry. This can be done with a directed solution based etchant such as potassium hydroxide (KOH). Etching may form standoff posts 34 on the second side 28B of the cover. FIG. 6 shows a working layer 36 such as copper deposited on the second side 28B of the cover 28 to facilitate a second etching process on the first side 28A. The working layer 36 may be deposited by sputtering or other means as currently known or to be developed. In one example embodiment, a function of the working layer 36 is to protect the first side of the cover from the etchant. Alternately, the standoff posts can be formed on the first side 20A of the substrate 20. The standoff posts 34 not only provide registration of the adhesive sheet 42, but also provide consistent separation between the substrate 20 and the cover 28.

FIG. 7 shows a second example etching process 38 that may be used to form holes 40 through the cover 28 for through-connections, or vias. FIG. 8 shows the finished patterned cover 28 after stripping off the working layer 36 and the mask material 30. Stripping may be done by a wet chemical etch that selectively etches the working layer. If the working layer is copper, ferric chloride may be used as the preferred etchant. The cover 28 may now be coated with silicon dioxide 39 ($SiO_2$) by thermal oxidation or plasma enhanced chemical vapor deposition, as a way of electrically isolating the vias formed in the cover from the solder and MEMS device. It will be appreciated that sputtered $SiO_2$ could also be used.

Figure 10:
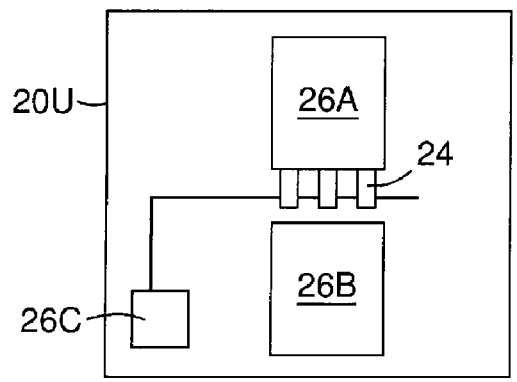
FIG. 10 shows a first side view of a MEMS unit area on the MEMS substrate 20.
Figure 11:
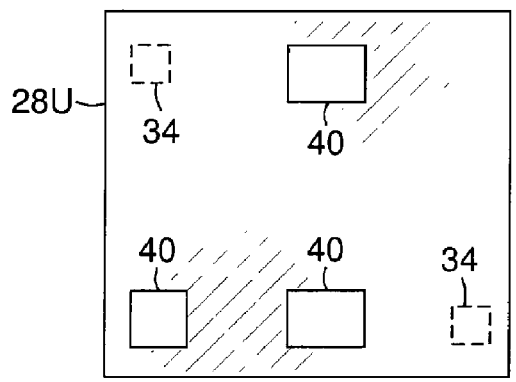
FIG. 11 shows a first side view of a unit area of the cover corresponding to the area of FIG. 10.
Figure 12:
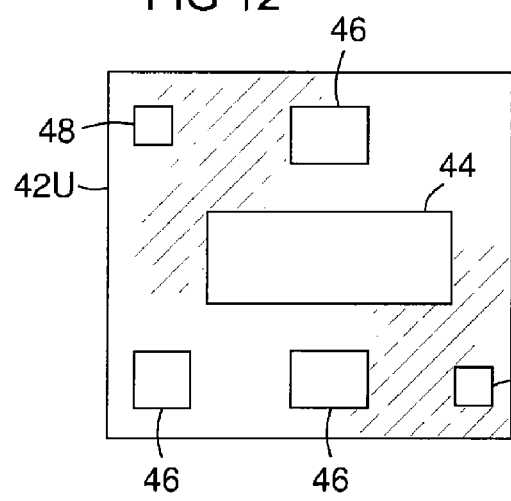
FIG. 12 shows a first side view of a unit area of the adhesive sheet corresponding to the area of FIG. 10.
Figure 13:
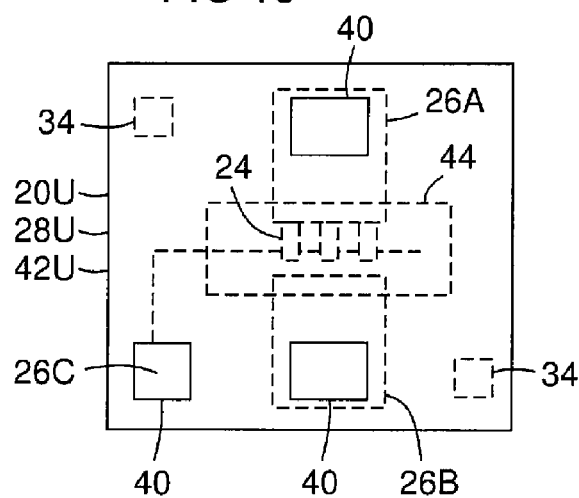
FIG. 13 shows a first side view of the MEMS device of FIG. 10 sealed with the cover and adhesive sheet of FIGS. 11-12.

FIG. 9 shows a first side 42A of an adhesive sheet 42 that is cut, for example by precise laser machining or die punching, depending on accuracy requirements, to match the MEMS substrate 20 and the cover 28, and is patterned with cutouts 44, 46, 48 for the MEMS devices, vias, and standoff posts respectively within unit areas 42U. The adhesive sheet may be about 50 microns thick or in a range of 10-500 microns. FIG. 10 shows a unit area 20U of the MEMS substrate 20. FIGS. 11 and 12 show corresponding areas 28U, 42U of the cover 28 and the LCP sheet 42 respectively.

Figure 14:
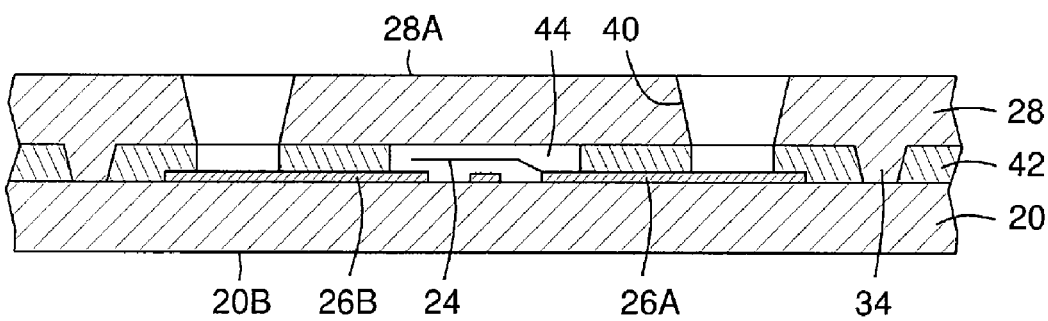
FIG. 14 is a partial sectional view of the cover bonded to the MEMS substrate via the intermediate adhesive sheet.

FIG. 14 is a partial sectional view of the cover 28 bonded to the MEMS substrate 20 via the intermediate adhesive sheet 42. This bonding may be done in the following stages: 1) Place the cover 28 on the adhesive sheet 42 with the standoff posts 34 inserted in the standoff cutouts 48 in the adhesive sheet. This accurately registers the patterns of the cover 28 and the adhesive sheet 42. 2) Tack the adhesive sheet 42 to the cover 28 by applying a first temperature sufficient to adhere the adhesive to the cover. For example if the adhesive sheet is LCP a first temperature of about 200° C. or in the range from about 100° C. to about 400° C. may be used. 3) Place the cover 28 on the MEMS substrate 20 with the adhesive sheet 42 between them. The cover 28 may be registered with the MEMS substrate 20 using conventional wafer alignment and fixturing techniques. 4) Heat the layers so that the adhesive sheet reaches a second temperature sufficient to bond the MEMS substrate, the adhesive sheet, and the cover together. For example if the adhesive sheet is LCP, a second temperature of about 290° C. or in the range from about 230° C. to about 400° C. for 60 minutes may be used.

The standoff posts 34 may be arranged to maintain a constant separation between the MEMS substrate 20 and the cover 28. The standoff posts 34 may be about 90% as tall as the adhesive sheet thickness, or in a range of 85-98% as tall.

Clamping pressure may be used to press the cover and substrate toward each other during bonding to eliminate voids between the adhesive sheet and the cover or substrate. The height of the standoff posts 34 allows the adhesive sheet to flow sufficiently to bond the substrate and cover, and to conform to the edges of the pads 26A-C, without spreading into the cutouts. The standoff posts 34 allow sufficient pressure to be applied to overcome minor warping of the substrate or cover that may have occurred during fabrication. Thus a wider range of fabrication techniques and more forgiving tolerances of flatness of the cover and substrate can be used, increasing yield, and reducing cost.

Figure 15:
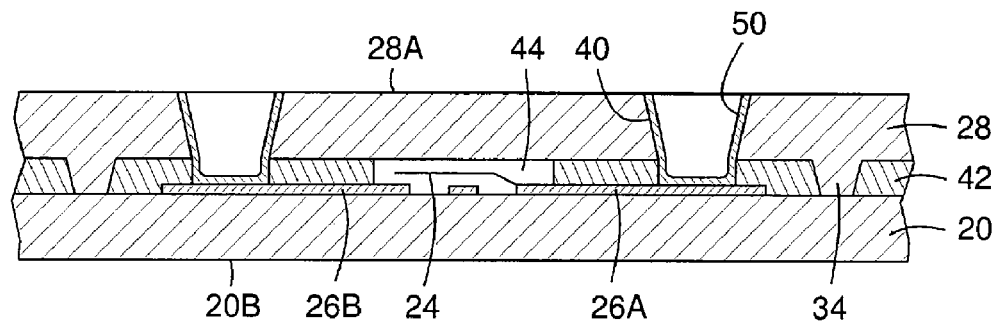
FIG. 15 is a partial sectional view showing a metal lining the vias.
Figure 16:
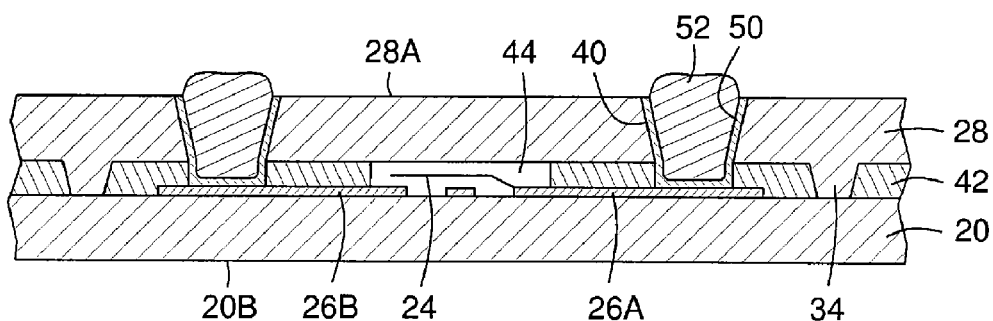
FIG. 16 shows the vias filled with solder, providing solder leads.
Figure 17:
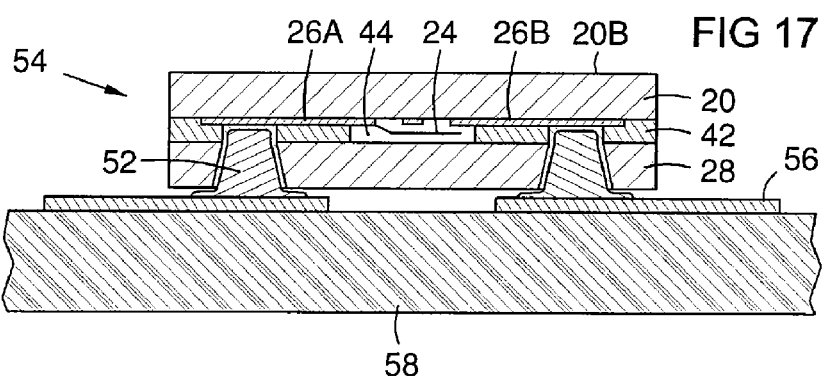
FIG. 17 shows a singulated MEMS device soldered to a circuit board.

FIG. 15 shows a lining 50 of a metal such as copper applied in the vias 40 through either a liftoff process or a patterned wet etch process as a primer layer for solder. The lining 50 may also be applied by sputtering. FIG. 16 shows the vias 40 filled with solder 52 that provide external leads/bumps. The bonded layers 20, 28, and 42 may then be diced or separated along their MEMS unit boundaries 20U, 28U, 42U, producing individual, or singulated, packaged MEMS units 54. FIG. 17 shows a singulated MEMS package 54 soldered to contacts 56 on a circuit board 58. It will be appreciated that the vias do not have to be solder filled. For example, in lieu of solder-filled vias one could perform stud bumping with a suitable material, such as gold. This approach would still keep the direct path from the MEMS device to a next level assembly and provide a flip-chip capability.

It will be appreciated that a MEMS packaging technology embodying aspects of the present invention provides advantages over other capping methods such as eutectic bonding or thermal compression bonding. For example, LCP bonds strongly to silicon without additional adhesives, and provides an effective hermetic seal that prevents moisture and oxygen from entering the device cavity. This provides a simple, low-cost bonding process. In addition, wafer-level capping protects the MEMS devices while the atmosphere is controlled, prior to dicing. The capping also enables the devices to be sealed with a controlled environment, such as a specific gas, Nitrogen or Argon, and a desired pressure. This allows greater flexibility for wafer-level testing and dicing, because, once capped, the devices are no longer subject to contamination from those activities. This allows a higher device yield and higher reliability.

The above described structural and/or operational relationships produce a covered MEMS device on a substrate. An adhesive sheet is disposed between the substrate and the cover. It has cutouts for the MEMS device. Standoff posts span between the substrate and the cover though further cutouts in the adhesive sheet. The substrate, the adhesive sheet, and the cover are bonded together in registration, and vias are provided to pads on the MEMS device. The MEMS device is sealed and protected from contamination. The atmosphere of the MEMS chamber is clean, and the adhesive does not intrude upon the MEMS device. This is all achieved at a high production yield and low cost.

One embodiment of the invention can use LCP as the adhesive sheet. LCP is highly hermetic, allowing reduced seal margins, thus smaller MEMS packages. It exhibits a helium permeability of $2.19*10^{-11}$ $cm^3*atm/s$. It has low moisture absorption of 0.1% at 23° C. over 24 hours. It bonds to glass, copper, gold, silicon, LCP, and other materials without additional adhesives at a relatively low transition temperature of about 280° C. The bonding occurs above this glass transition temperature. The amount of temperature over 280° C. will affect the fluidity of the LCP. In contrast, polyimide is much more moisture absorbent (0.4-2.5% at 23° C. over 24 hours), has a higher coefficient of expansion, and higher transition temperature; epoxy seals are less hermetic; glass frit uses higher temperatures, and can contaminate the MEMS with particles; brazed metal is expensive and conductive; glass-to-glass anodic bonding uses a high temperature; gold-to-gold thermo-compression bonding is conductive.

After capping, the MEMS package 54 can be soldered directly to a circuit board as in FIG. 17 using the solder bumps 52 directly under the MEMS package by heating the MEMS package and/or the circuit board to a solder reflow temperature. This requires negligible lead space between the MEMS package and the circuit board contacts, and has no changes of lead direction between the MEMS pads and the circuit board contacts. Thus it reduces radio frequency reflections and interference caused by angles and other discontinuities in the conduction path, and improves thermal performance. The bonding of the adhesive sheet uses a temperature low enough not to interfere with the MEMS device. At higher temperatures the device actuators can bend, altering the device performance or causing device failure. Thus, this technology provides a low cost, hermetically sealed, high-yield, reliable, low-profile package that allows relatively high power interconnects.

It is contemplated that a package embodying aspects of the present invention may provide the ability to continue wafer processing after capping. It is further contemplated that if the lid is kept planar, then the package can be made compatible with multi-chip interconnect technology, such as "chips first" multi-chip module (MCM) processes. Also a package embodying aspects of the present invention may be compatible with conventional die handling equipment and infrastructure, e.g. reel packaging, pick and place machines, etc.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A MEMS unit comprising:
   a MEMS device on a substrate;
   a cover;
   an adhesive sheet comprising cutouts for the MEMS device;
   the adhesive sheet disposed between the substrate and the cover;
   standoff posts spanning between the substrate and the cover; and
   the substrate, the adhesive sheet, and the cover bonded together in registration;
   whereby the MEMS device is sealed and protected from contamination.

2. The MEMS unit of claim 1 wherein:
   the cover further comprises through-holes for vias;
   the adhesive sheet further comprises respective cutouts for the vias; and
   the vias are filled with electrically conductive material from the MEMS device to an exterior surface of the cover.

3. The MEMS unit of claim 2 wherein the standoff posts extend from the cover, and the adhesive sheet further comprises respective cutouts for the standoff posts, thereby providing registration between the adhesive sheet and the cover.

4. A method for making a MEMS unit as in claim 3, comprising:
   forming multiple MEMS devices on the substrate;

forming a cover for the multiple MEMS devices, wherein the cover is formed with respective standoff posts and respective through-holes for the vias;

patterning the adhesive sheet with respective cutouts for the MEMS devices, the vias, and the standoff posts;

the standoff posts ranging from about 85% to about 98% as tall as a thickness of the adhesive sheet before bonding;

placing the adhesive sheet between the substrate and the cover;

bonding the cover, the adhesive sheet, and the substrate together by heating them;

metalizing the vias to form leads from the MEMS devices to the exterior surface of the cover; and dicing the MEMS devices into individual unit packages after the above steps are complete;

whereby the MEMS devices are protected from contamination during dicing.

5. The method of claim 4, wherein the placing and bonding steps comprise:

placing the cover in registration with the patterned adhesive sheet by inserting the standoff posts into the respective cutouts in the adhesive sheet;

tacking the adhesive sheet to the cover by raising the temperature of the cover to a first temperature sufficient to adhere the adhesive sheet to the cover;

placing the adhesive sheet and the cover on the substrate in registration with the MEMS devices; and heating the MEMS substrate, adhesive sheet, and cover to a second temperature sufficient to bond them together without additional adhesive.

6. The method of claim 4, wherein the cover is formed from a silicon wafer by applying first and second etching masks to respective first and second sides of the cover, and removing parts of the cover through patterns in the masks by etching techniques to create the standoff posts and through-holes, then coating or growing an insulating film over the silicon cover to provide electrical isolation between the leads.

7. The method of claim 4 wherein the bonding step further comprises applying a clamping pressure in a range from about 1 PSI to about 200 PSI between the cover and the substrate 8. A method of packaging microelectromechanical systems (MEMS) devices, comprising:

forming multiple MEMS devices and electrical contact pads therefor on a first side of a MEMS substrate;

forming first and second etching masks on respective first and second sides of a cover;

reducing parts of the second side of the cover by etching through the second etching mask, thus forming standoff posts on the second side of the cover;

depositing a working layer on the second side of the cover;

reducing parts of the first side of the cover by etching through the first etching mask to the working layer, thus forming through-holes in the cover for vias;

stripping the working layer and the etching masks from the cover;

patterning an adhesive sheet to match the cover and the MEMS substrate with respective cutouts in the adhesive sheet for the MEMS devices, the vias, and the standoff posts;

bonding the second side of the cover to the first side of the MEMS substrate using the adhesive sheet as a bonding layer, with the through-holes of the cover in registration with the respective cutouts in the adhesive sheet and with the pads of the MEMS substrate;

metalizing the through-holes in the cover and the respective cutouts in the adhesive sheet for the vias to form leads; and singulating the now-sealed MEMS devices into individual packages after the above steps are complete.

9. The method of claim 8, wherein the bonding step comprises:

placing the patterned adhesive sheet in registration with the cover by inserting the cover standoff posts into the respective cutouts in the adhesive sheet for the standoff posts;

tacking the adhesive sheet to the cover by raising the temperature of the cover to a first temperature sufficient to adhere the adhesive sheet to the cover;

placing the adhesive sheet and the cover on the MEMS substrate; and heating the MEMS substrate, the adhesive sheet, and the cover to a second temperature sufficient to bond them together without additional adhesive.

10. The method of claim 8, wherein the etching masks are formed of silicon nitride ($Si_3N_4$), and the reducing steps comprise anisotropic etching by potassium hydroxide (KOH).

11. The method of claim 8, wherein the depositing step comprises sputtering a layer of copper on the second side of the cover to form the working layer.

12. The method of claim 8, further comprising after the stripping step coating the cover with silicon dioxide ($SiO_2$).

13. The method of claim 8, wherein the standoff posts are in the range from about 85% to about 98% as tall as a thickness of the adhesive sheet before bonding.

14. The method of claim 13, wherein the standoff posts are about 90% as tall as a thickness of the adhesive sheet.

15. A sealed assembly of MEMS units comprising:

a plurality of MEMS devices on a substrate;

a cover for the plurality of MEMS devices, the cover comprising standoff posts and through-holes for vias;

an adhesive sheet comprising respective cutouts for the MEMS devices, the standoff posts, and the vias;

the adhesive sheet disposed between the substrate and the cover;

the standoff posts spanning between the substrate and the cover, providing separation therebetween, and providing registration between the cover and the adhesive sheet;

the substrate, the adhesive sheet, and the cover bonded together in registration; and the vias metalized;

whereby the MEMS devices are sealed and protected from contamination.

16. A sealed MEMS device singulated from the sealed assembly of claim 15.

17. The MEMS unit of claim 2 wherein at least a portion of the electrically conductive material of the MEMS device is in contact with the adhesive sheet.

* * * * *